United States Patent
Kishimoto

[11] Patent Number: 6,057,242
[45] Date of Patent: May 2, 2000

[54] FLAT INTERLAYER INSULATING FILM SUITABLE FOR MULTI-LAYER WIRING

[75] Inventor: Koji Kishimoto, Tokyo, Japan

[73] Assignee: NEC Corporation, Tokyo, Japan

[21] Appl. No.: 09/264,884

[22] Filed: Mar. 9, 1999

Related U.S. Application Data

[62] Division of application No. 08/827,507, Mar. 28, 1997.

[30] Foreign Application Priority Data

Mar. 29, 1996 [JP] Japan ................... 8-075793

[51] Int. Cl.$^7$ .................................... H01L 21/00
[52] U.S. Cl. .................. 438/692; 438/693; 438/694; 438/697; 438/699
[58] Field of Search .................... 438/692, 697, 438/699, 771, 774, 788, 694, 784, 632

[56] References Cited

U.S. PATENT DOCUMENTS

| | | |
|---|---|---|
| 5,356,513 | 10/1994 | Burke . |
| 5,502,007 | 3/1996 | Murase . |
| 5,552,628 | 9/1996 | Watanabe et al. ................ 257/632 |
| 5,563,105 | 10/1996 | Dobuzinsky et al. ............. 438/784 |
| 5,578,531 | 11/1996 | Kodera et al. . |
| 5,703,404 | 12/1997 | Matsuura ........................ 257/758 |
| 5,753,564 | 5/1998 | Fukada . |
| 5,753,975 | 5/1998 | Matsuno ........................ 257/751 |

FOREIGN PATENT DOCUMENTS

| | | |
|---|---|---|
| 6-283485 | 10/1994 | Japan . |
| 6-302704 | 10/1994 | Japan . |
| 6-326065 | 11/1994 | Japan . |
| 63-333919 | 12/1994 | Japan . |
| 7-45616 | 2/1995 | Japan . |
| 7-297193 | 11/1995 | Japan . |
| 8-64595 | 3/1996 | Japan . |

OTHER PUBLICATIONS

T. Usami et al., "Low Dielectric Constant Interlayer Using Fluorine Doped Silicon Oxide", Extended Abstracts of the 1993 International Conference on Solid State Devices and Materials, (1993), pp. 161–163.

M. B. Anand, "VMI Technology Choices–0.4$\mu$ m and Beyond", SEMI Technology Symposium, Dec. (1994), pp. 179–185.

*Primary Examiner*—Felisa Hiteshew
*Assistant Examiner*—Binh X. Tran
*Attorney, Agent, or Firm*—Foley & Lardner

[57] ABSTRACT

There is provided a method of fabricating a semiconductor device, including the steps of forming lower wiring layers on a semiconductor substrate, forming a first silicon oxide film by PECVD, forming a second silicon oxide film containing fluorine by PECVD so that the second silicon oxide film covers the first silicon oxide film and further so that portions thereof formed between the lower wiring layers have a top surface lower than a top surface of portions of the first silicon oxide film located on the lower wiring layers, forming a third silicon oxide film by PECVD so that the third silicon oxide film covers the second silicon oxide film and further so that portions of the third silicon film formed between the lower wiring layers have a top surface higher than a top surface of portions of the first silicon oxide film located on the lower wiring layers, the second silicon oxide film having a greater polishing rate than polishing rates of the first and third silicon oxide films, chemically and mechanically polishing the third and second silicon oxide films until a top surface of portions of the first silicon oxide film located on the lower wiring layers appears, and forming a fourth silicon oxide film by PECVD. The above mentioned method provides an interlayer insulating film having a low dielectric constant and a planarized surface suitable for multi-layer wiring.

22 Claims, 8 Drawing Sheets

FLAT INTERLAYER INSULATING FILM SUITABLE FOR MULTI-LAYER WIRING

This application is a divisional of application Ser. No. 08/827,507 filed Mar. 28, 1997.

BACKGROUND OF THE INVENTION

1. Field of the Invention

The invention relates to a semiconductor device and a method of fabricating the same, and more particularly to an interlayer insulating film suitable for electrically insulating metal wiring layers such as an aluminum layer from other layers, and a method of fabricating the same.

2. Description of the Related Art

As a semiconductor device has been fabricated smaller and smaller in size, it is not avoidable to adopt a multi-layer wiring in a structure of a semiconductor device. An insulating layer made of silicon dioxide has been employed as an interlayer insulating film for a semiconductor device having a multi-layer wiring structure. With a semiconductor device having been fabricated in a higher density, there arises a problem that a semiconductor device cannot operate at a higher operation speed because of signal delay caused by parasitic capacitance between wirings. A conventionally used silicon dioxide film has a dielectric constant of about 3.9 at smallest, and thus it is expected to develop an insulating layer having a lower dielectric constant.

There is another problem that if there is a large irregularity on a surface of an interlayer insulating film, a resist pattern cannot be formed because of shortage of the focusing margin in a photolithography step for formation of an upper wiring layer, and that even if a resist pattern could be formed, an upper wiring layer might be broken at a large irregularity of an underlying interlayer insulating film, and a portion of material of which a wiring layer is made would not be etched out and would remain as residue. For these reasons, an interlayer insulating film is required to have a flat surface. As a semiconductor device is fabricated in a higher density, an exposure device having a higher numerical aperture is employed in a photolithography step in order to form a more fine wiring, in which case there will arise a problem of a decreased focusing margin. Thus, an interlayer insulating film is required to have a flat surface across the chip size.

In brief, an interlayer insulating film to be used for a highly integrated semiconductor device having a multi-layer wiring structure is required to have a low dielectric constant for filling a space formed between wirings therewith, and to have a flat surface across the chip size.

Recently, an attempt of adding fluorine (F) into a silicon dioxide film for lowering a dielectric constant has drawn attention. For instance, one of methods of making a fluorine containing silicon dioxide film has been suggested in the abstract of International Conference on Solid State Device and Materials, pp. 161–163, 1993. A conventional parallel plate type plasma-enhanced chemical vapor deposition apparatus is employed as a film making apparatus, and tetra ethyl ortho silicate (hereinafter, referred to simply as "TEOS"), $C_2F_6$ and oxygen ($O_2$) are used as materials from which the film is made. According to the abstract, a dielectric constant of an interlayer insulating film is reduced down to about 3.7 with an increase of an amount of $C_2F_6$.

Another method of making a fluorine containing interlayer insulating film has been suggested in an article found in SEMI Technology Symposium prepublished booklet, pp. 179–185, 1994. This method employs the same apparatus as the above mentioned, but gas species as a fluorine addition agent are varied for making a film. The article analyzed three gas species; $NF_3$, $CF_4$ and $C_2F_6$. The article stated that the employment of $C_2F_6$ reduced a dielectric constant of the film down to 3.4. In general, a dielectric constant is reduced with an increase in an amount of fluorine to be added to an interlayer insulating film.

As an alternative, chemical mechanical polishing (hereinafter, referred to simply as "CMP") has attracted attention these days as a process for planarizing a surface of an interlayer insulating film at a chip size. For instance, Japanese Unexamined Patent Publication No. 6-283485 has suggested a method of fabricating a semiconductor device in which method CMP is performed on a fluorine containing silicon dioxide film. Hereinbelow is explained the method.

First, as illustrated in FIG. 1A, there is formed an insulating film 2 made of silicon dioxide on a silicon substrate 1. Then, a patterned lower wiring layer 3 made of metal such as aluminum is formed on the insulating film 2. Then, as illustrated in FIG. 1B, there is formed a fluorine containing silicon dioxide film 4 on the lower wiring layer 3 and the insulating film 2 by plasma-enhanced chemical vapor deposition (hereinafter, referred to simply as "PECVD") employing TEOS gas to which $NF_3$ is added. Then, as illustrated in FIG. 1C, there is deposited a silicon dioxide film 5 containing no fluorine on the fluorine containing silicon dioxide film 4 so that the silicon dioxide film 5 containing no fluorine has a top surface higher than a top surface of the lower wiring layer 3.

Then, as illustrated in FIG. 1D, the no fluorine containing silicon dioxide film 5 is polished by CMP until a top surface of the fluorine containing silicon dioxide film 4 appears. In CMP, since the fluorine containing silicon dioxide film 4 has a lower polishing rate than that of the no fluorine containing silicon dioxide film 5, the fluorine containing silicon dioxide film 4 has a function of a stopper for CMP. Specifically, when the fluorine containing silicon dioxide film 4 begins to be polished, the polishing speed seems to decrease to zero. Thus, the polishing of the no fluorine containing silicon dioxide film 5 is stopped when a top surface of the fluorine containing silicon dioxide film 4 appears, resulting in that the no fluorine containing silicon dioxide film 5 has a top surface nearly on a level with a top surface of the fluorine containing silicon dioxide film 4.

Then, as illustrated in FIG. 1E, a via hole 6 is formed in communication with the lower wiring layer 3 by means of photolithography, wet etching and dry etching. Then, as illustrated in FIG. 1F, an upper wiring layer 7 made of metal such as aluminum is formed by sputtering, photolithography and dry etching so that the upper wiring layer 7 covers a resultant therewith.

Another method of CMP using a stopper has been suggested in Japanese Unexamined Patent Publication No. 6-326065. In this method, layers made of soft polishing material and layers made of hard polishing material are alternately deposited, and flatness of an interlayer insulating film is improved by utilizing a difference between polishing rates of the soft and hard materials. Hereinbelow is explained the method in detail.

As illustrated in FIG. 2A, there is formed an insulating film 10 on a silicon substrate 9. Then, a patterned lower wiring layer 11 made of metal such as aluminum is formed on the insulating film 10. Then, as illustrated in FIG. 2B, there is formed an interlayer insulating film 12 covering the lower wiring layer 11 and the insulating film 10 therewith.

Then, over the interlayer insulating film 12 are deposited a hard polishing material layer 13a, a soft polishing material layer 14 and a hard polishing material layer 13b in this order. The lower hard polishing -material layer 13a acts as a polishing stopper for prevention of over-polishing to thereby enhance planarization of an interlayer insulating layer.

Then, as illustrated in FIG. 2C, portions of both the hard polishing material layer 13b and the soft polishing material layer 14 located above the lower wiring layer 11 are removed by CMP. That is, the hard polishing material layer 13b and the soft polishing material layer 14 are chemically and mechanically polished until a top surface of the lower hard polishing material layer 13a located above the lower wiring layer 11 appears. Portions 13bb of the upper hard polishing material layer 13b located between the patterned lower wiring layers 11 are not removed even by CMP, but it cooperates with portions 13aa of the lower hard polishing material layer 13a located above the lower wiring layers 11 to form a continuous planarized top surface.

Then, as illustrated in FIG. 2D, the portions 13bb of the upper hard polishing material layer 13b are removed by polishing or wet etching. Thus, portions 14a of the soft polishing material layer 14 located between the patterned lower wiring layers 11 and the portions 13aa of the lower hard polishing material layer 13a cooperate with each other to form a continuous, planarized top surface.

However, the above firstly mentioned method suggested in Japanese Unexamined Patent Publication No. 6-283485 has problems as follows.

The first problem is that if the fluorine containing silicon dioxide film 4 contains fluorine at a high concentration, the upper wiring layer 7 corrodes where it makes direct contact with the fluorine containing silicon dioxide film 4 with the result of formation voids 16 at an interface between the fluorine containing silicon dioxide film 4 and the upper wiring layer 7, as illustrated in FIG. 1F. In particular, where the upper wiring layer 7 made of aluminum makes direct contact with the fluorine containing silicon dioxide film 4 within the via hole 6, the upper wiring layer 7 is attenuated due to corrosion to thereby have a tendency of being readily broken.

The reason is that if fluorine makes a direct bond with silicon, such Si-F bonding is stable, however, if fluorine makes insufficient bond with silicon, hydrolysis will readily take place due to moisture in the air, and hence hydrogen fluoride (HF) is produced. In particular, if the fluorine containing silicon dioxide film 4 had a low density and was porous, cubical expansion thereof will readily take place because of hydrolysis thereof, resulting in hydrogen fluoride (HF) being readily produced.

The second problem is that a fluorine containing silicon dioxide film has a lower polishing rate than a polishing rate of a no fluorine containing silicon dioxide film in CMP.

The reason is as follows. A generally used slurry for CMP is aqueous solution including silica ($SiO_2$) as abrasive particles and potassium hydroxide (KOH) as dispersion medium. The solution kept at a pH value at 11 or greater. Particles of a polished silicon dioxide film are dissolved into the solution for removal. Thus, while a fluorine containing silicon dioxide film is polished, fluorine is released out of the fluorine containing silicon dioxide film to thereby reduce the pH value of the solution. Hence, the polishing rate of the fluorine containing silicon dioxide film is reduced.

The third problem is that there are produced voids 17, as illustrated in FIG. 1B. The reason of the production of the voids 17 is that reaction takes place mainly in gas phase because oxidation of TEOS is facilitated due to addition of fluorine, and also because a pressure is high, specifically 1 Torr or higher, due to the use of a parallel plate type PECVD apparatus with the result that a shape of the fluorine containing silicon dioxide film 4 is deteriorated.

The fourth problem is that if an amount of fluorine source gas is increased for lowering the dielectric constant, there are formed cavities 18 on a surface of the insulating film 2, as illustrated in FIG. 1B.

The reason is as follows. As fluorine source gas, $CF_4$ and/or $C_2F_6$ gases are used. However, these gases are originally etching gases to be used for etching $SiO_2$, and an etching rate of those gases is further increased in the presence of oxygen ($O_2$). Thus, if an amount of $CF_4$ and/or $C_2F_6$ gases relative to an amount of TEOS is increased in order to lower a dielectric constant, the underlying insulating film 2 is first etched before the fluorine containing silicon dioxide film 4 is deposited on the insulating film 2.

The secondly mentioned method suggested in Japanese Unexamined Patent Publication No. 6-326065 has also problems as follows.

The first problem in the secondly mentioned method is that if either the hard polishing material layers 13a, 13b or the soft polishing material layer 14 is composed of a fluorine containing silicon dioxide film, an aluminum wiring layer such as an upper wiring layer is corroded at a via hole or a place where an aluminum wiring layer makes direct contact with a fluorine containing silicon dioxide film for the same reason as that of the first problem of the firstly mentioned Publication. In the case that an interlayer insulating film is composed of a fluorine containing silicon dioxide film, corrosion would take place in an aluminum layer for the same reason as mentioned above.

The second problem is that it is not possible to have a semiconductor device operated at a higher operation speed, a space between wirings is quite small. The reason is as follows. Even if either an interlayer insulating film, a hard polishing material layer or a soft polishing material layer is composed of a film having a low dielectric constant, it is quite small in volume. Thus, the use of a low dielectric constant film does not provide much advantage.

SUMMARY OF THE INVENTION

In view of the foregoing problems of the prior methods, it is an object of the present invention to provide a semiconductor device and a method of fabricating the same both of which are capable of providing an interlayer insulating film to be disposed around a metal wiring layer, which film has a low dielectric constant for enabling a semiconductor device to operate at a higher speed and has a planarized surface in chip size suitable for a multi-layer wiring structure.

In one aspect, there is provided a semiconductor device including (a) a semiconductor substrate, (b) an insulating film formed over a principal surface of the semiconductor substrate, (c) a plurality of lower wiring layers formed on the insulating film between which recesses are formed, (d) a first silicon oxide film covering both the lower wiring layer and insulating film therewith, (e) a second silicon oxide film containing fluorine therein, formed on the first silicon oxide film and within the recesses, and (f) a third silicon oxide film formed on both the first silicon oxide film and the second silicon oxide film.

It is preferable for the first silicon oxide film to contain nitrogen therein. It is also preferable that the second silicon oxide film has a top surface lower than a top surface of the first silicon oxide film, and that the third silicon oxide film has a planarized top surface. The above mentioned semiconductor device may further include an upper wiring layer formed on the third silicon oxide film.

In another aspect, there is provided a method of fabricating a semiconductor device, including the steps of (a) forming an insulating film on a semiconductor substrate, (b) forming a plurality of lower wiring layers on the insulating film, recesses being formed between the lower wiring layers, (c) forming a first silicon oxide film by plasma-enhanced chemical vapor deposition so that the first silicon oxide film covers both the lower wiring layers and the insulating film, (d) forming a second silicon oxide film containing fluorine by plasma-enhanced chemical vapor deposition so that the second silicon oxide film covers the first silicon oxide film and further so that portions of the second silicon oxide film formed in the recesses have a top surface lower than a top surface of portions of the first silicon oxide film located on the lower wiring layers, (e) forming a third silicon oxide film by plasma-enhanced chemical vapor deposition so that the third silicon oxide film covers an upper surface of the second silicon oxide film and further so that portions of the third silicon film formed in the recesses have a top surface higher than a top surface of portions of the first silicon oxide film located on the lower wiring layers, the second silicon oxide film having a greater polishing rate than polishing rates of the first and third silicon oxide films, (f) chemically and mechanically polishing the third and second silicon oxide films until a top surface of portions of the first silicon oxide film located on the lower wiring layers appears so that the third silicon oxide film has a planarized top surface on a level with a top surface of portions of the first silicon oxide film located on the lower wiring layers, and (g) forming a fourth silicon oxide film by plasma-enhanced chemical vapor deposition so that the fourth silicon oxide film entirely covers the first, second and third silicon oxide films therewith.

There is further provided a method of fabricating a semiconductor device, including the steps of (a) forming an insulating film on a semiconductor substrate, (b) forming a plurality of lower wiring layers on the insulating film, recesses being formed between the lower wiring layers, (c) forming a first silicon oxide film by plasma-enhanced chemical vapor deposition so that the first silicon oxide film covers both the lower wiring layers and the insulating film, (d) forming a second silicon oxide film containing fluorine by plasma-enhanced chemical vapor deposition so that the second silicon oxide film covers the first silicon oxide film and further so that portions of the second silicon oxide film formed in the recesses have a top surface higher than a top surface of portions of the first silicon oxide film located on the lower wiring layers, the second silicon oxide film having a greater polishing rate than a polishing rate of the first silicon oxide film, (e) chemically and mechanically polishing the second silicon oxide film until a top surface of portions of the first silicon oxide film located on the lower wiring layers appears so that the second silicon oxide film has a planarized top surface on a level with a top surface of portions of the first silicon oxide film located on the lower wiring layers, and (f) forming a third silicon oxide film by plasma-enhanced chemical vapor deposition so that the third silicon oxide film entirely covers the first and second silicon oxide films therewith.

When the plasma-enhanced chemical vapor deposition is conducted for the formation of the first silicon oxide film in the step (c), it is preferable that two high frequency voltages are used. When plasma-enhanced chemical vapor deposition is conducted for the formation of the second silicon oxide film in the step (d), it is preferable that a high frequency voltage is applied to the semiconductor substrate.

When CMP is conducted in the step (e), slurry including pure water, silica dispersed in the pure water, ammonium acetate ($CH_3COONH_4$) and ammonia ($NH_4OH$) and having pH at 7 may be used.

The first silicon oxide film may include nitrogen therein. When plasma-enhanced chemical vapor deposition is conducted for the formation of the second silicon oxide film in the step (d), silicon tetrafluoride ($SiF_4$), silane ($SiH_4$), oxygen ($O_2$) and argon (Ar) gases may be used as process gases, in which case, a ratio in flow rate of $SiF_4$ to $SiF_4$ and $SiH_4$, that is $SiF_4/SiF_4+SiH_4$), is preferably in the range of 0.2 to 0.9 both inclusive. As an alternative, when plasma-enhanced chemical vapor deposition is conducted for the formation of the second silicon oxide film in the step (d), silicon tetrafluoride ($SiF_4$), oxygen ($O_2$), hydrogen ($H_2$) and argon (Ar) gases may be used as process gases.

There may be conducted bias-sputtering in the step (d) in place of the plasma-enhanced chemical vapor deposition.

The above mentioned method may further include the steps of (h) forming a via hole on the lower wiring layers, (i) covering the via hole and the third silicon oxide film with a metal film, (j) filling the via hole with metal, and (k) forming an upper wiring layer on both the via hole and the third silicon oxide film.

Hereinbelow is described how the above mentioned present invention works on the basis of the experiments having been conducted by the inventor.

First, there is prepared slurry composed of pure water including silica dispersed -therein by 20 wt %. Without any additives, the slurry is weak acid, specifically, has a pH value at 6. Ammonium acetate ($CH_3COONH_4$) is added to the slurry by an amount in the range of 0.1 to 0.3 mol/l, and then ammonia ($NH_4OH$) is further added to the slurry to shift pH of the slurry to pH 7 (neutral) or pH 9 (alkaline). Using the thus prepared slurry, CMP is conducted to a silicon dioxide film made from TEOS and $O_2$ by PECVD.

FIG. 3 shows plots of a polishing rate vs. a total amount of added ammonium acetate, in which an ordinate axis represents a polishing rate normalized at pH 9 without ammonium acetate and an abscissa axis represents a concentration of ammonium acetate ($CH_3COONH_4$). As is obvious in FIG. 3, when ammonium acetate is not added, namely a concentration of ammonium acetate is zero, a silicon dioxide film is scarcely polished at pH 6. In contrast, when the slurry is neutral or alkaline, a silicon dioxide film can be polished. However, a silicon dioxide film can be polished even at pH 6 merely by adding a small amount of ammonium acetate to the slurry.

A principle of the above mentioned phenomenon is as follows.

In general, in alkaline condition, OH— basics are adsorbed at a surface of silica particles dispersed in the slurry, and hence a surface of silica particles are charged with negative electricity. Positive charges being present in the slurry loosely surround the negatively charged silica particles, and thus there are formed electrically double layers, which are dispersed in a slurry medium in a colloidal form. The reason why the silica particles do not get together to thereby sink in the slurry is that electrostatic repulsive forces between the above mentioned electrically double layers, which is inherent to hydrophobic colloid, are greater than Van der Waals attractive forces between the silica particles. Since addition of a small amount of electrolyte such as ammonium acetate to the slurry decreases a thickness of the electrically double layers, Van der Waals attractive forces between the silica particles become greater than repulsive forces between the electrically double layers, resulting in that the silica particles get together or agglomerate.

In accordance with the above mentioned principle, when the slurry contains no ammonium acetate or is kept at pH 9, the electrically double layers present around a surface of the silica particles is thick with the result that the silica particles are not allowed to get together. Thus, silicon dioxide particles having been scraped from a silicon dioxide film become colloidal and are dissolved into the slurry.

On the other hand, when ammonium acetate is added to the slurry whose pH value is controlled in the range of pH 6 to pH 7, the electrically double layers become thin, and hence the silica particles are facilitated to get together. That is, the agglomeration of the silica particles makes larger diameter secondary particles, and thus mechanical polishing is enhanced to a silicon dioxide film, resulting in that a polishing rate is increased.

Silicon dioxide particles scraped during a silicon dioxide film polishment get together or agglomerate, and thus it is considered that agglomerated silicon dioxide particles are difficult to dissolve in the slurry. However, it is confirmed that since the agglomerated silicon particles have an increased particle diameter, they can be sufficiently removed by brush washing after polishing.

FIG. 4 shows the dependency of polishing rates of a fluorine containing silicon dioxide film on a fluorine concentration in a slurry having pH values at pH 7 and pH 9. When the slurry has a pH value at pH 9 and contains no ammonium acetate, it is understood that a polishing rate is reduced with an increase in an amount of added fluorine. On the other hand, when the slurry has a pH value at pH 7 and contains ammonium acetate, a polishing rate is increased with an increase in an amount of added fluorine. The reason is considered that fluorine is dissolved into the slurry out of a fluorine containing silicon dioxide film while the film is being polished and thus the slurry become acid to thereby facilitate agglomeration of silica particles with the result that mechanical polishing function is enhanced which in turn increases a polishing rate.

As mentioned above, it is possible to have an optimal selection ratio between a fluorine containing silicon dioxide film and a no fluorine containing silicon dioxide film by suitably controlling a pH value of the slurry used in CMP, and thus, a fluorine containing silicon dioxide film can be polished with a no fluorine silicon dioxide film being used as a stopper.

As a method of forming a fluorine containing silicon dioxide film, there are bias CVD and bias sputtering.

In bias CVD, there is used a highly densified plasma source such as electron cyclotron resonant excitation plasma, helicon wave type excitation plasma and inductive coupling type excitation plasma as a plasma source to thereby sufficiently decompose source gas and facilitate reaction of the source gas. In addition, it is possible to increase a density of a fluorine containing silicon dioxide film, form a strong Si—F bonding, and fill a tiny space between wirings with a fluorine containing silicon dioxide film, by applying a high frequency voltage to a substrate. In addition, since the film is highly densified, it does not absorb moisture even if it stands in the air, and hence wiring layers are never corroded. Furthermore, the inventor has confirmed that it is possible to fill a space with the film on the condition that an aspect ratio is 2.5 and a space between wirings is 0.25 $\mu$m.

The use of silicon tetrafluoride ($SiF_4$) as a fluorine supply gas makes it possible to prevent an underlying insulating film from being etched when $CF_4$ and $C_2F_6$ gases are used. In addition, the addition of silane ($SiH_4$) or hydrogen ($H_2$) makes it possible to remove insufficiently bonded fluorine in the film in the form of hydrogen fluoride (HF), and thereby form a fluorine containing silicon dioxide film consisting of strong Si—F bondings. However, it should be noted that when $SiH_4$ gas is used, an increase in $SiH_4$ flow rate decreases an amount of fluorine contained in a fluorine containing silicon dioxide film.

On the other hand, in bias sputtering, since a stable fluorine containing silicon dioxide film is used as sputtering material, corrosion of wiring layers never takes place. The inventor has confirmed that it is possible to fill a space with the film on the condition that an aspect ratio is 2.5 and a space between wirings is 0.25 $\mu$m.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

The first embodiment in accordance with the present invention will be explained hereinbelow with reference to FIGS. 5 and 7A to 7H.

Figure 5:
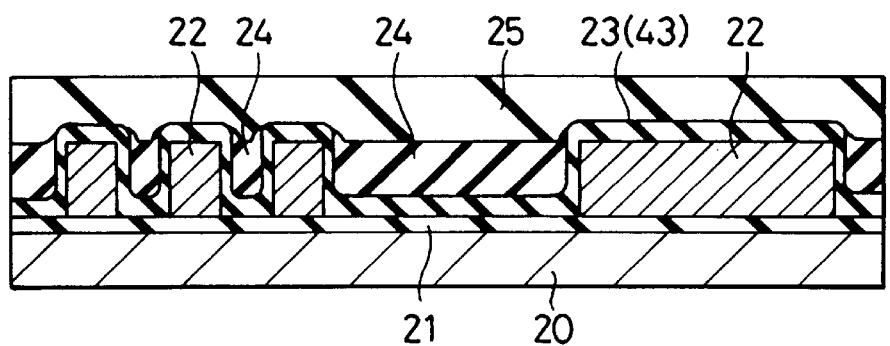
FIG. 5 is a cross-sectional view of a semiconductor device made in accordance with the first embodiment of the present invention.

FIG. 5 is a cross-sectional view of a semiconductor device made in accordance with the first embodiment, in particular illustrating interlayer insulating films. As illustrated, an insulating film 21 such as a silicon dioxide film ($SiO_2$) is formed on a silicon substrate 20, and a plurality of lower wiring layers 22 are formed on the insulating film 21. A silicon dioxide film 23 as a first interlayer insulating film covers an entire surface of the lower wiring layers 22 and portions of the insulating layer 21 located where the lower wiring layers 22 are not formed.

A fluorine containing silicon dioxide film 24 as a second interlayer insulating film is formed on the silicon dioxide film 23 so that the fluorine containing silicon dioxide film 24 fills recesses formed between the lower wiring layers 22 therewith. The silicon dioxide film 23 as a first interlayer insulating film prevents the lower wiring layers 22 from being corroded due to the fluorine containing silicon dioxide film 24, and further acts as a stopper when CMP is conducted. The fluorine containing silicon dioxide film 24 as a second interlayer insulating film reduces a dielectric constant of all the interlayer insulating films.

A silicon dioxide film 25 as a third interlayer insulating film covers portions of the silicon dioxide film 23 located on the lower wiring layers 22 and the fluorine containing silicon dioxide film 24. The silicon dioxide film 25 has a planarized surface over a chip.

Figure 7A:
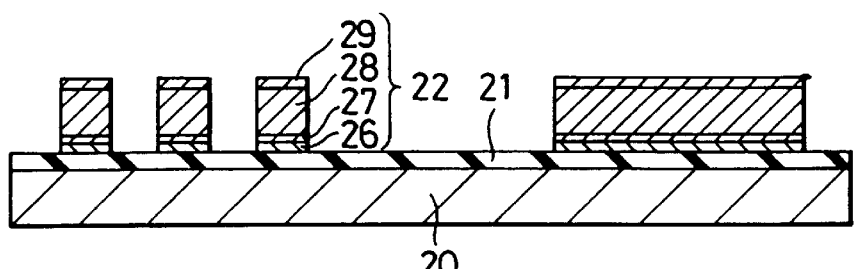
FIGS. 7A to 7H are cross-sectional views of a semiconductor device made in accordance with the first embodiment, showing respective step of a method of fabricating the same.

A method of fabricating the above mentioned semiconductor device is explained hereinbelow with reference to FIGS. 7A to 7H. First, as illustrated in FIG. 7A, the insulating film 21 such as a silicon dioxide film is formed on the silicon substrate 20. Then, on the insulating film 21 are formed a titanium film 26, a titanium nitride film 27, aluminum-silicon-copper alloy film 28 and a titanium nitride film 29 acting as a anti-reflection film in this order, which have a thickness of about 0.06 μm, 0.1 μm, 0.7 μm and 0.05 μm, respectively. Then, there is formed a line pattern (not illustrated) made of photoresist by means of photolithography. Then, the titanium nitride film 29, Al—Si—Cu alloy film 28, titanium nitride film 27 and titanium film 26 are successively dry-etched in accordance with the line pattern. Thus, as illustrated in FIG. 7A, there are formed a plurality of the lower wiring layers 22 each having a layered structure.

Figure 7B:
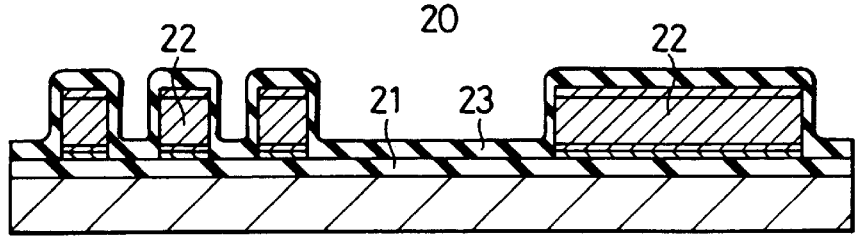

Then, as illustrated in FIG. 7B, the silicon dioxide film 23 is deposited by about 0.15 μm thickness on the insulating film 21 and the lower wiring layers 22 by means of PECVD employing TEOS and $O_2$ gas as source material. The silicon dioxide film 23 is deposited by means of a parallel plate type PECVD apparatus with two high frequency voltages of 250 kHz and 13.56 MHz to thereby generate plasma and further with a substrate temperature being at 350° C. and a pressure in the apparatus being about 1.8 Torr.

Figure 7C:
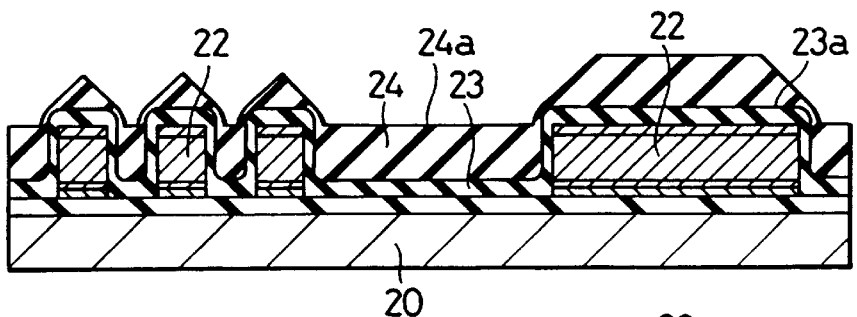

Then, as illustrated in FIG. 7C, the fluorine containing silicon dioxide film 24 is deposited by about 0.75 μm thickness on the silicon dioxide film 23 by PECVD. The fluorine containing silicon dioxide film 24 is deposited by PECVD in which electron cyclotron resonant excitation plasma is produced using $SiF_4$, $SiH_4$, $O_2$ and Ar gases with a high frequency voltage of 13.56 MHz being applied to the silicon substrate 20 for generating the plasma. The other conditions are as follows:

Micro-wave Power: 2.8 kw
High Frequency Power: 1.0 kw
Pressure: 1 mTorr
Flow ratio of $SiF_4$ to $SiF_4$ and $SiH_4$ ($SiF_4/(SiF_4+SiH_4)$): about 0.6

In addition, a substrate temperature is kept at about 400° C. or smaller while the fluorine containing silicon dioxide film 24 is being deposited, by cooling the substrate 20 with cooling medium of about 80° C. When the fluorine containing silicon dioxide film 24 is deposited on the above mentioned conditions, fluorine is contained therein at about 10 atomic %, and a dielectric constant as a single layer is reduced down to about 3.5. At this stage, the fluorine containing silicon dioxide film 24 located in the recesses formed between the lower wiring layers 22 has a top surface 24a lower than a top surface 23a of the silicon dioxide film 23 located on the lower wiring layers 22.

Figure 7D:
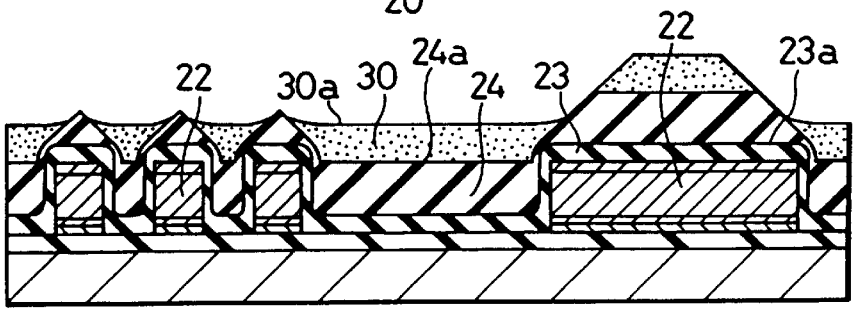

Then, as illustrated in FIG. 7D, the silicon dioxide film 30 is deposited by about 0.8 μm thickness on the fluorine containing silicon dioxide film 24 by PECVD where electron cyclotron resonant excitation plasma is produced using $SiH_4$, $O_2$ and Ar gases. The deposition conditions are as follows:

Micro-Wave Power: 2.8 kw
High Frequency Power: 0.5 kw
Pressure: about 1 mTorr

The silicon dioxide film 30 is deposited only on an upper surface 24a of the fluorine containing silicon dioxide film 24, as illustrated in FIG. 7D, in which case the silicon dioxide film 30 located in the recesses formed between the lower wiring layers 22 has an upper surface 30a higher than the top surface 23a of the silicon dioxide film 23 located on the lower wiring layers 22.

Figure 7E:
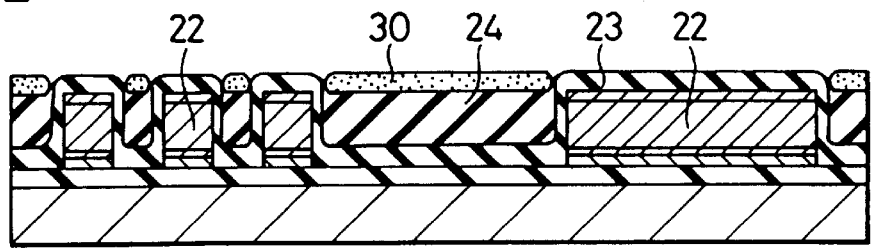

Then, as illustrated in FIG. 7E, portions of both the silicon dioxide film 30 and the fluorine containing silicon dioxide film 24 located above the lower wiring layers 22 are removed by CMP. Thus, the silicon dioxide film 30 having a polished top surface and the fluorine containing silicon dioxide film 24 remain in the recesses formed between the lower wiring layers 22. When the silicon dioxide film 30 and the fluorine containing silicon dioxide film 24 are removed by CMP, the silicon dioxide film 23 located lower wiring layers 22 and the silicon dioxide film 30 remaining in the recesses formed between the lower wiring layers 22 act as a stopper for CMP. The slurry used in CMP is one including pure water, silica dispersed in the pure water, ammonium acetate ($CH_3COONH_4$) and ammonia ($NH_4OH$), which ammonium acetate and ammonia causes the slurry to have a pH value at 7.

Figure 7F:
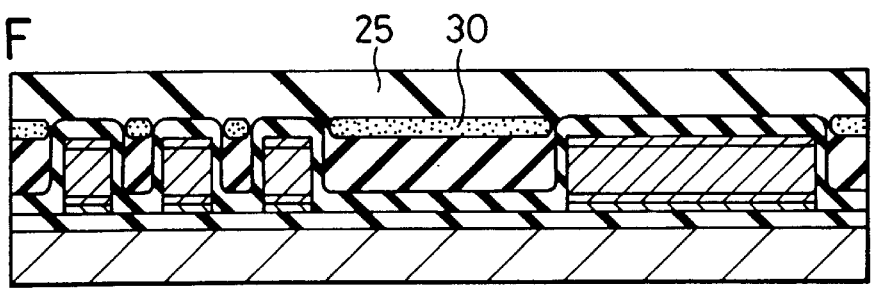

Then, as illustrated in FIG. 7F, a silicon dioxide film 25 is deposited by about 0.8 μm thickness over a resultant by PECVD employing TEOS and $O_2$ gas. Then, thermal annealing is conducted at about 400° C. in ten minutes to an hour in nitrogen atmosphere to thereby make all the interlayer insulating films in dense and stable condition. It should be noted that the silicon dioxide film 30 remaining in the recesses formed between the lower wiring layers 22 after CMP and the silicon dioxide film 25 deposited over the silicon dioxide film 30 are illustrated as a common film in FIG. 5.

Figure 7G:
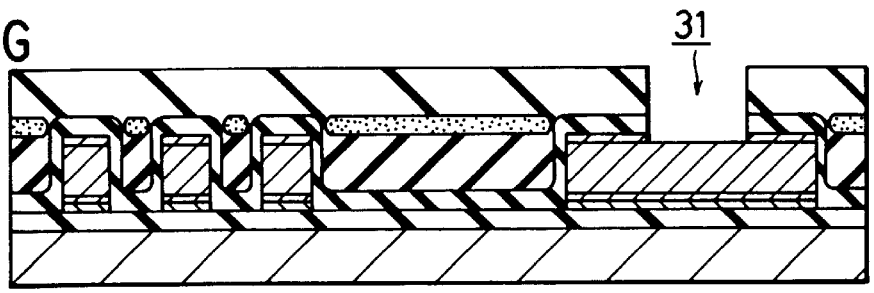
Figure 7H:
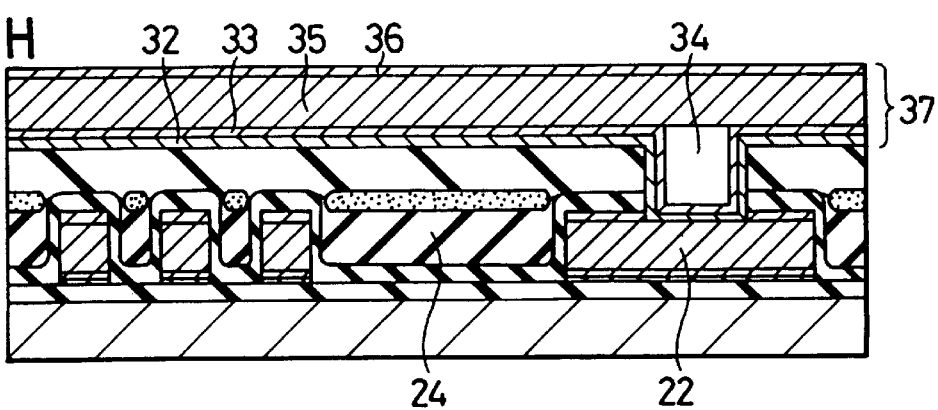

Then, as illustrated in FIG. 7G, there is formed a via hole 31 in communication with the lower wiring layer 22 by means of photolithography and dry etching. Then, as illustrated in FIG. 7H, there are formed a titanium film 32 and a titanium nitride film 33 over a resultant by sputtering, followed by deposition of a tungsten film 34 by CVD. Then, a resultant is etched back to thereby cause only the via hole 31 to be filled with the tungsten film 34. Then, aluminum-silicon-copper alloy film 35 and a titanium nitride film 36 are formed over a resultant by sputtering. The films 32, 33, 35 and 36 are patterned by means of photolithography and dry etching to thereby make an upper wiring layer 37. Thus, a two wiring layer structure is completed in a semiconductor device in accordance with the first embodiment.

Figure 1A:
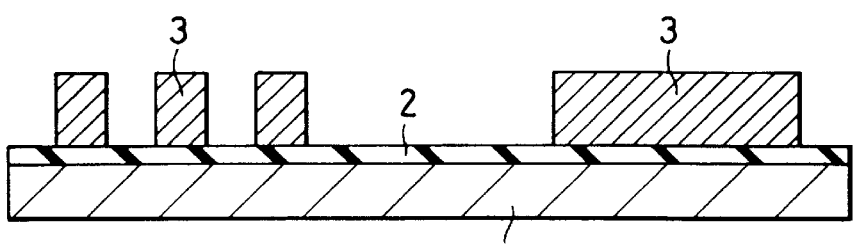
FIGS. 1A to 1F are cross-sectional views of a conventional semiconductor device, showing respective steps of a method of fabricating the semiconductor device.
Figure 1B:
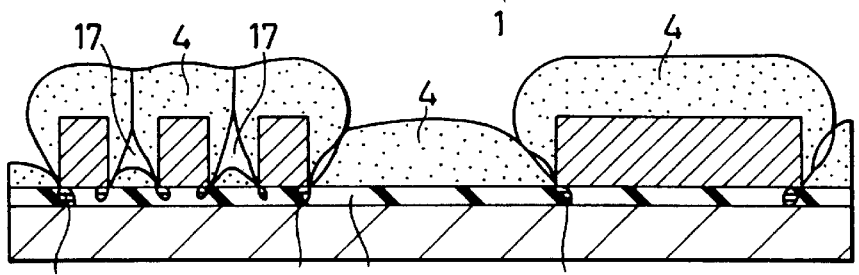
Figure 1C:
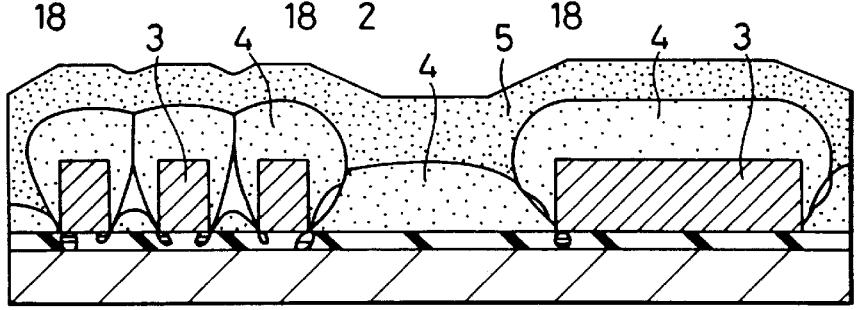
Figure 1D:
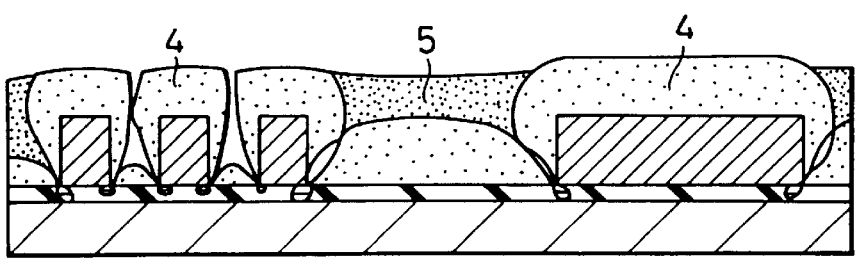
Figure 1E:
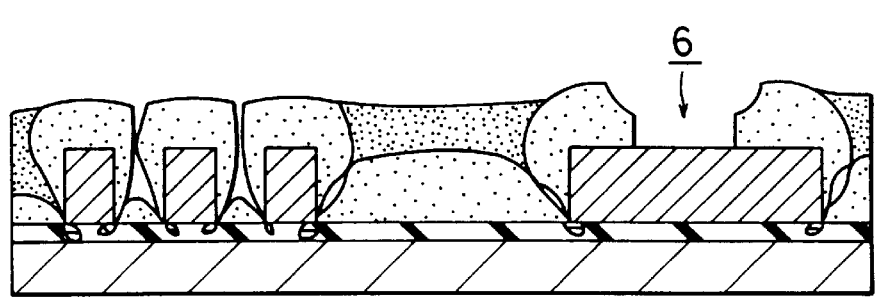
Figure 1F:
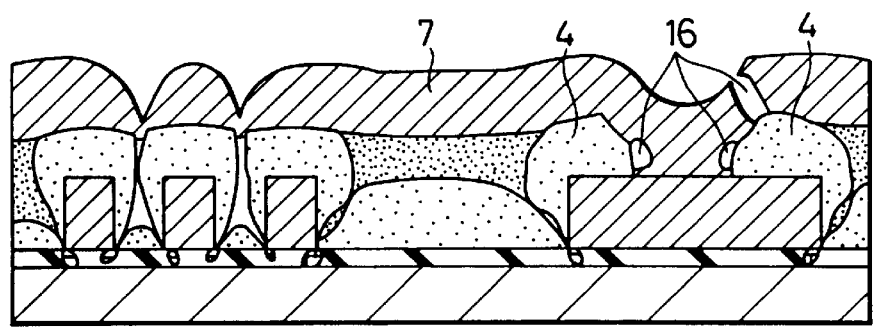
Figure 2A:
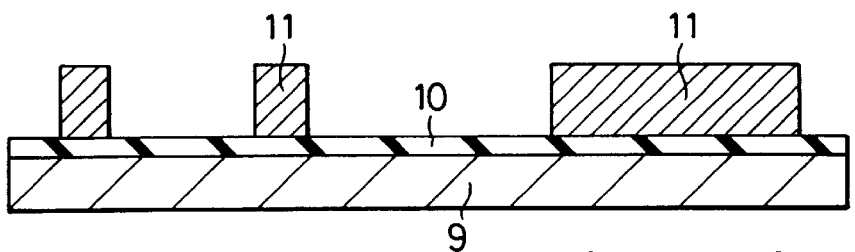
FIGS. 2A to 2D are cross-sectional views of another conventional semiconductor device, showing respective steps of a method of fabricating the semiconductor device.
Figure 2B:
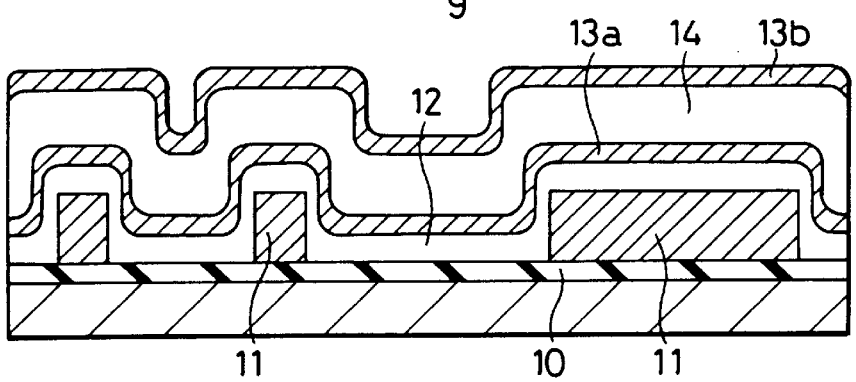
Figure 2C:
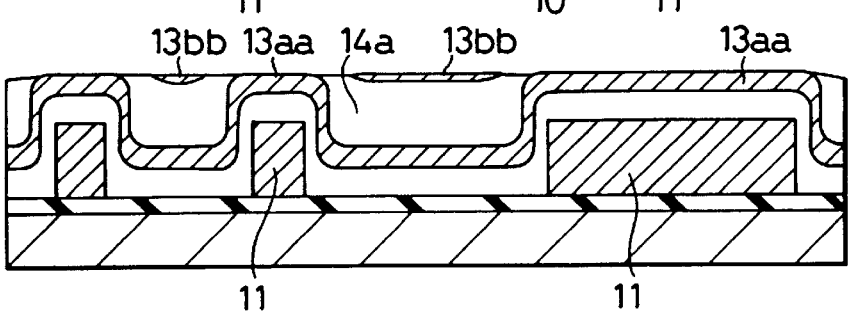
Figure 2D:
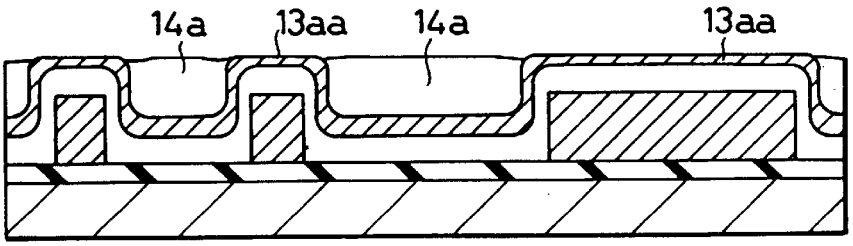
Figure 3:
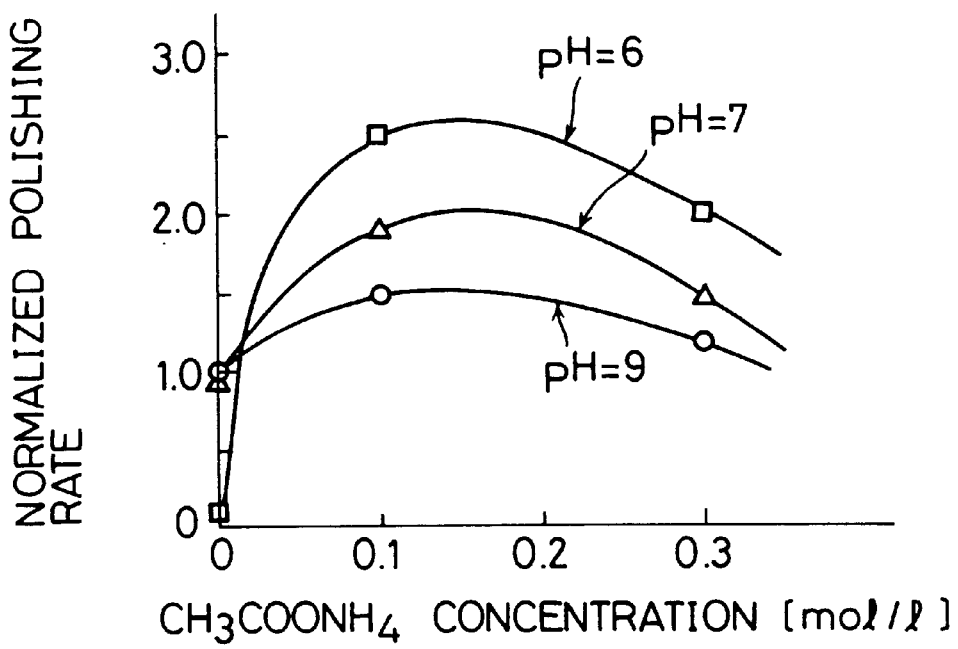
FIG. 3 is a graph illustrating a relation between a polishing rate in CMP and a concentration of ammonium acetate in a slurry for each pH value of the slurry.
Figure 4:
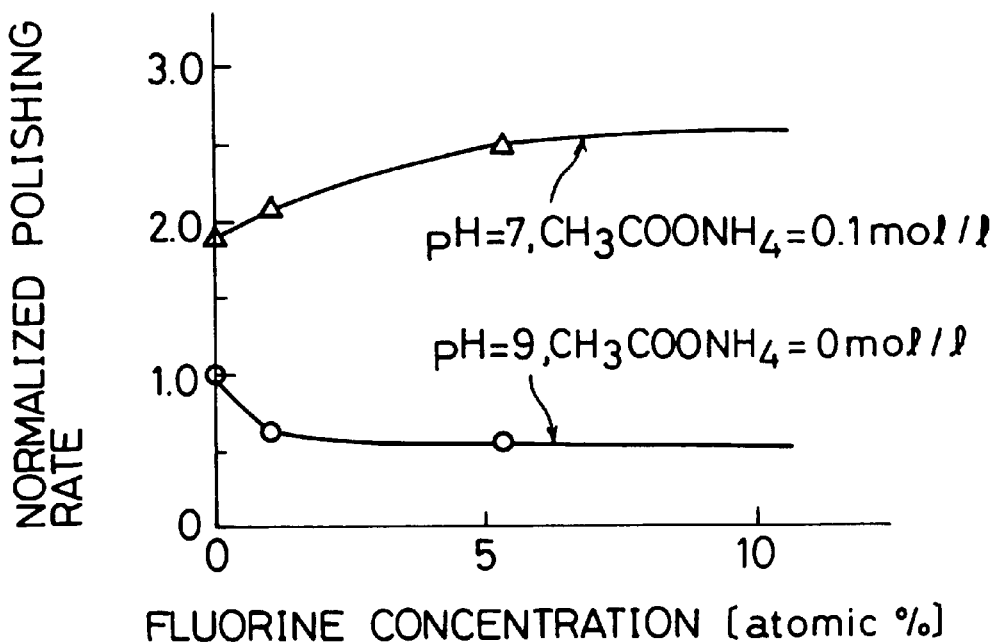
FIG. 4 is a graph illustrating a relation between a polishing rate in CMP and a concentration of fluorine in a fluorine containing silicon dioxide film for each pH value of the slurry.

In the above mentioned semiconductor device, the fluorine containing silicon dioxide film 24 does not make a direct contact with the wiring layers 22 and 37 made of metal such as aluminum, as illustrated in FIG. 7H, and hence there is no fear that the wiring layers are corroded with the result of the formation of the voids 16 and 17 (See FIGS. 1B and 1F).

In addition, since there is used high density PECVD where a high frequency voltage is applied to the silicon substrate 20 in order to form the fluorine containing silicon dioxide film 24, the fluorine containing silicon dioxide film 24 has a high density. Thus, even if the fluorine containing silicon dioxide film 24 stands in the air, it does not absorb moisture and hence keeps film quality.

In the above mentioned embodiment, $SiF_4$ gas is used as a process gas for adding fluorine into the fluorine containing silicon dioxide film 24. Thus, there does not take place etching of the underlying insulating film 21 unlike the earlier mentioned conventional method in which the underlying insulating layer is etched by $CF_4$ and $C_2F_6$ to be used for etching $SiO_2$. In addition, the addition of $SiH_4$ and $H_2$ gases into process gases makes it possible to remove excessive fluorine, which is produced during the deposition of the fluorine containing silicon dioxide film 24, in the form of hydrogen fluoride (HF).

In the above mentioned embodiment, when CMP is conducted, there is used the slurry which is made neutral, namely made to have a pH value at 7 by adding ammonium acetate and further ammonia thereinto. The use of the slurry enhances mechanical polishing effect to thereby make a polishing rate of the fluorine containing silicon dioxide film 24 greater than a polishing rate of the silicon dioxide films 23 and 30, enabling to have a sufficient selection ratio. As a result, the silicon dioxide films 23 and 30 can act as a stopper for CMP, and hence it is possible to form interlayer insulating films having a planarized top surface.

In addition, since the underlying silicon dioxide film 23 has a thickness of about 0.15 $\mu$m and the fluorine containing silicon dioxide film 24 has a thickness of about 0.75 $\mu$m, the fluorine containing silicon dioxide film 24 can have a great volume ratio in the interlayer insulating films insulating the lower and upper wiring layers 22 and 37 from each other, resulting in that a dielectric constant in all of the interlayer insulating films is decreased, and hence it is possible to prevent signal delays.

The step of forming the silicon dioxide film 30, as illustrated in FIG. 7D, may be replaced with a step mentioned hereinbelow.

Figure 8:
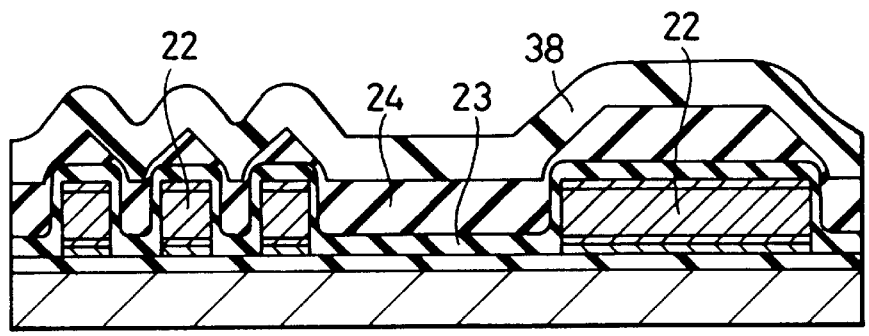
FIG. 8 is a cross-sectional view of a variant of the semiconductor device illustrated in FIGS. 7A to 7H, showing an alternative step for a method of fabricating a semiconductor device made in accordance with the first embodiment.

After the recesses formed between the lower wiring layer 22 have been filled with the silicon dioxide film 23 and the fluorine containing silicon dioxide film 24, a silicon dioxide film 38 is deposited by about 1.0 $\mu$m thickness all over the fluorine containing silicon dioxide film 24 by PECVD employing TEOS and $O_2$, as illustrated in FIG. 8. The silicon dioxide film 38 is deposited by means of a parallel plate type PECVD apparatus with two high frequency voltages of 250 kHz and 13.56 MHz to thereby generate plasma and further with a substrate temperature being at 350° C. and a pressure in the apparatus being about 1.8 Torr. This method causes the silicon dioxide film 38 to be deposited on sidewalls of the fluorine containing silicon dioxide film 24 as well as a top surface thereof unlike when electron cyclotron resonant excitation plasma is used. The following steps are the same as those having been explained with reference to FIGS. 7E to 7H.

In the above mentioned embodiment, electron cyclotron resonant excitation plasma is employed in order to form the fluorine containing silicon dioxide film 24 and the silicon dioxide film 30. However, it should be noted that there may be employed other highly densified plasma sources such as helicon wave type excitation plasma and inductive coupling type excitation plasma in place of electron cyclotron resonant excitation plasma. Similarly, bias sputtering may be employed in place of the above mentioned highly densified plasma-enhanced CVD in which a high frequency voltage is applied to a substrate. The bias sputtering provides the same shape and characteristics to the films 24 and 30 as those provided by high density PECVD.

A semiconductor device made in accordance with the second embodiment of the present invention is explained hereinbelow with reference to FIGS. 6 and 9A to 9C.

Figure 6:
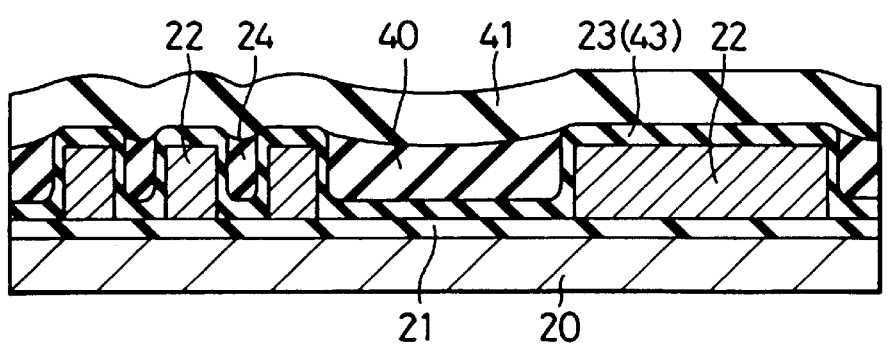
FIG. 6 is a cross-sectional view of a semiconductor device made in accordance with the second embodiment of the present invention.

FIG. 6 is a cross-sectional view of a semiconductor device made in accordance with the second embodiment, in particular illustrating interlayer insulating films. Elements or parts corresponding to those in the first embodiment illustrated in FIG. 5 have been provided with the same reference numerals. As illustrated, an insulating film 21 such as a silicon dioxide film ($SiO_2$) is formed on a silicon substrate 20, and a plurality of lower wiring layers 22 are formed on the insulating film 21. A silicon dioxide film 23 as a first interlayer insulating film covers an entire surface of the lower wiring layers 22 and portions of the insulating layer 21 located where the lower wiring layers 22 are not formed.

A fluorine containing silicon dioxide film 40 as a second interlayer insulating film is formed on the silicon dioxide film 23 so that the fluorine containing silicon dioxide film 40 fills recesses formed between the lower wiring layers 22 therewith. The silicon dioxide film 23 as a first interlayer insulating film prevents the lower wiring layers 22 from being corroded due to the fluorine containing silicon dioxide film 40, and further acts as a stopper when CMP is conducted. The fluorine containing silicon dioxide film 40 as a second interlayer insulating film is used as a low dielectric constant film.

A silicon dioxide film 41 as a third interlayer insulating film covers portions of the silicon dioxide film 23 located on the lower wiring layers 22 and the fluorine containing silicon dioxide film 40. The silicon dioxide film 41 has such a planarized top surface that an upper wiring layer can be formed without any breakage thereof.

A method of fabricating the above mentioned semiconductor device is explained hereinbelow with reference to FIGS. 9A to 9C. The method explained hereinbelow has the same steps as the steps having been described with reference to FIGS. 7A and 7B. That is, the method has the same steps as the above mentioned method until the silicon dioxide film 23 is formed.

Figure 9A:
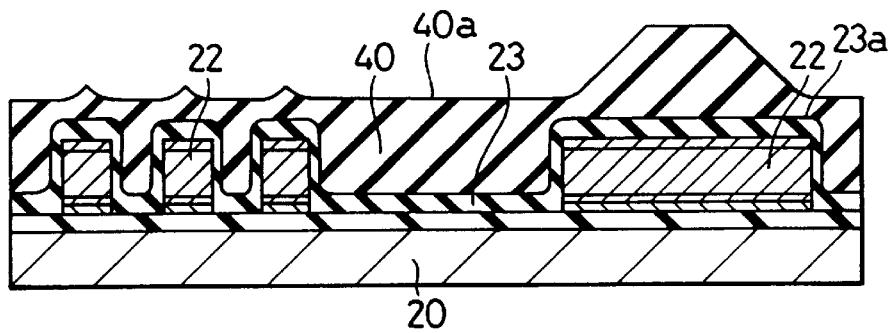
FIGS. 9A to 9C are cross-sectional views of a semiconductor device made in accordance with the second embodiment, showing respective step of a method of fabricating the same.

After the silicon dioxide film 23 is formed, as illustrated in FIG. 9A, the fluorine containing silicon dioxide film 40 is deposited by about 1.2 $\mu$m thickness on the silicon dioxide film 23. The fluorine containing silicon dioxide film 40 is deposited by PECVD in which electron cyclotron resonant excitation plasma is produced employing $SiF_4$, $O_2$, $H_2$ and Ar gases as source gases with a high frequency voltage of 13.56 MHz being applied to the silicon substrate 20 for generating the plasma. The other conditions are as follows:

Micro-wave Power: 2.8 kw

High Frequency Power: 1.0 kw

Pressure: about 1 mTorr $SiF_4$ Flow Rate: 50 sccm $O_2$ Flow Rate: 100 sccm $H_2$ Flow Rate: about 20 sccm In addition, a substrate temperature is kept at about 400° C. or smaller while the fluorine containing silicon dioxide film 40 is being deposited, by cooling the substrate 20 with cooling medium of about 80° C. When the fluorine containing silicon dioxide film 40 is deposited on the above mentioned conditions, fluorine is contained therein at about 8 atomic %, and a dielectric constant as a single layer is reduced down to about 3.6. At this stage, in contrast to the first embodiment, the fluorine containing silicon dioxide film 40 located in the recesses formed between the lower wiring layers 22 has a top surface 40a higher than a top surface 23a of the silicon dioxide film 23 located on the lower wiring layers 22.

Figure 9B:
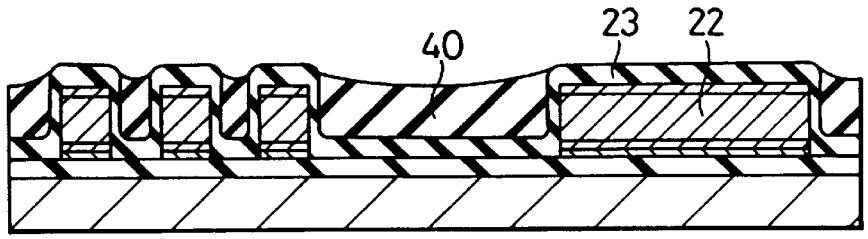

Then, as illustrated in FIG. 9B, portions of the fluorine containing silicon dioxide film 40 located above the lower wiring layers 22 are removed by CMP. Thus, the fluorine containing silicon dioxide film 40 having a polished upper surface remain in the recesses formed between the lower wiring layers 22. When the fluorine containing silicon dioxide film 40 are removed by CMP, the silicon dioxide film 23 located lower wiring layers 22 acts as a stopper for CMP. The slurry used in CMP is one including pure water, silica dispersed in the pure water, ammonium acetate ($CH_3COONH_4$) and ammonia ($NH_4OH$), which ammonium acetate and ammonia makes the slurry have a pH value at 7.

Figure 9C:
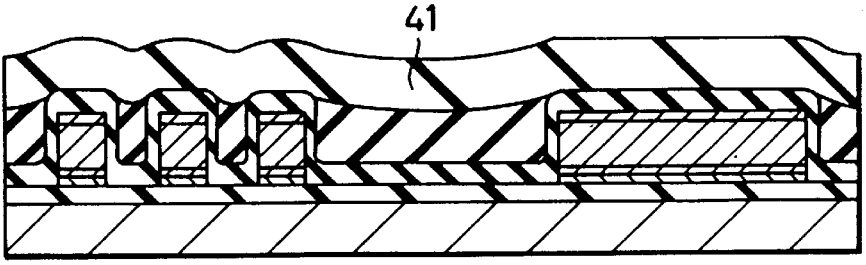

Then, as illustrated in FIG. 9C, a silicon dioxide film 41 is deposited by about 0.8 $\mu$m thickness by PECVD employing TEOS and $O_2$. Hereinafter, the steps described with reference to FIGS. 7G and 7H are carried out, thereby a double wiring layered structure in the second embodiment being completed.

The above mentioned second embodiment provides the same advantageous effects as those provided by the first embodiment. Similarly to the first embodiment, there may be employed other highly densified plasma sources such as helicon wave type excitation plasma and inductive coupling type excitation plasma in place of the above mentioned electron cyclotron resonant excitation plasma which is produced for forming the fluorine containing silicon dioxide film 40 (See FIG. 9A). Similarly, bias sputtering may be employed in place of high density PECVD in which a high frequency voltage is applied to a substrate.

The third and fourth embodiments are explained hereinbelow with reference to FIGS. 5 and 6, respectively. As illustrated in FIG. 5, a semiconductor device in accordance with the third embodiment is different from the first embodiment only in that a nitrogen containing silicon dioxide film 43 is employed in place of the silicon dioxide film 23, and as illustrated in FIG. 6, a semiconductor device in accordance with the fourth embodiment is different from the second embodiment only in that a nitrogen containing silicon dioxide film 43 is employed in place of the silicon dioxide film 23.

The nitrogen containing silicon dioxide film 43 is formed by replacing the silicon dioxide film formation step in the above mentioned first and second embodiment methods with a step of carrying out PECVD employing, for instance, TEOS and nitrous oxide ($N_2O$) as process gases.

In the semiconductor devices made in accordance with the third and fourth embodiments, the nitrogen containing silicon dioxide film 43 acts as a stopper for CMP, which improves a selection ratio in CMP between the fluorine containing silicon dioxide films 24, 40 and the nitrogen containing silicon dioxide film 43, comparing to the first and second embodiments in which the silicon dioxide film 23 is employed in place of the nitrogen containing silicon dioxide film 43. In addition, the use of PECVD employing two different high frequency voltages makes it possible to form the nitrogen containing silicon dioxide film 43 having the same shape as that of the silicon dioxide film 23. However, if the nitrogen containing silicon dioxide film 43 contains a greater amount of nitrogen therein, the above mentioned selection ratio can be enhanced, but a dielectric constant of the nitrogen containing silicon dioxide film 43 is also increased, which eliminates the reduction in a dielectric constant brought by the use of fluorine containing silicon dioxide films 24 and 40. Accordingly, an amount of nitrogen to be contained in the nitrogen containing silicon dioxide film 43 should be determined taking balance between the selection ratio in CMP and a dielectric constant in all of the interlayer insulating films into consideration. It is preferable that an amount of nitrogen to be added into the film 43 is as small as possible.

In accordance with the present invention, since a fluorine containing silicon dioxide film does not make a direct contact with a lower wiring layer made of metal such as aluminum, there is no fear that the lower wiring layer is corroded and that voids are produced due to corrosion of the lower wiring layer.

In addition, since there is used high density PECVD where a high frequency voltage is applied to a substrate in order to form a fluorine containing silicon dioxide film, the fluorine containing silicon dioxide film has a high to density. Thus, even if the fluorine containing silicon dioxide film stands in the air, it does not absorb moisture, and hence keeps film quality.

By using $SiF_4$ gas for adding fluorine into the fluorine containing silicon dioxide film, it is possible to prevent an underlying insulating film from being etched unlike conventional methods in which an underlying insulating layer is etched by $CF_4$ and $C_2F_6$. In addition, the addition of $SiH_4$ and $H_2$ gases into process gases makes it possible to remove excessive fluorine, which is produced during the deposition of a fluorine containing silicon dioxide film, in the form of hydrogen fluoride (HF).

The use of the slurry which is changed from being neutral to being acid by adding electrolyte salt thereinto enhances mechanical polishing effect in CMP to thereby make a polishing rate of a fluorine containing silicon dioxide film greater than a polishing rate of a silicon dioxide film, enabling to have a sufficient selection ratio therebetween. As a result, a silicon dioxide film can act as a stopper for CMP, and hence it is possible to form interlayer insulating films having a planarized top surface.

In addition, since an underlying silicon dioxide film is adapted to have a smaller thickness than a thickness of a fluorine containing silicon dioxide film, the fluorine containing silicon dioxide film can have a great volume ratio in interlayer insulating films interposed between lower and upper wiring layers, resulting in that a dielectric constant in all of interlayer insulating films is decreased, and hence it is possible to prevent signal delays.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims. For instance, it is allowed to vary a structure of wiring layers, a thickness of films, and film fabrication conditions in each steps.

The entire disclosure of Japanese Patent Application No. 8-75793 filed on Mar. 29, 1996 including specification, claims, drawings and summary is incorporated herein by reference in its entirety.

What is claimed is:

1. A method of fabricating a semiconductor device, comprising the steps of:
   (a) forming an insulating film on a semiconductor substrate;
   (b) forming a plurality of lower wiring layers on said insulating film, recesses being formed between said lower wiring layers;
   (c) forming a first silicon oxide film by plasma-enhanced chemical vapor deposition so that said first silicon oxide film covers both said lower wiring layers and said insulating film;
   (d) forming a second silicon oxide film containing fluorine by plasma-enhanced chemical vapor deposition so that said second silicon oxide film covers said first silicon oxide film and further so that portions of said second silicon oxide film formed in said recesses have a top surface lower than a top surface of portions of said first silicon oxide film located on said lower wiring layers;
   (e) forming a third silicon oxide film by plasma-enhanced chemical vapor deposition so that said third silicon oxide film covers an upper surface of said second silicon oxide film and further so that portions of said third silicon oxide film formed in said recesses have a top surface higher than a top surface of portions of said first silicon oxide film located on said lower wiring layers, said second silicon oxide film having a greater polishing rate than polishing rates of said first and third silicon oxide films;
   (f) chemically and mechanically polishing said third and second silicon oxide films until a top surface of portions of said first silicon oxide film located on said lower wiring layers appears so that said third silicon oxide film has a planarized top surface on a level with a top surface of portions of said first silicon oxide film located on said lower wiring layers; and
   (g) forming a fourth silicon oxide film by plasma-enhanced chemical vapor deposition so that said fourth silicon oxide film entirely covers said first, second and third silicon oxide films therewith.

2. The method as set forth in claim 1, wherein two high frequency voltages are used in said step (c) when said plasma-enhanced chemical vapor deposition is conducted for the formation of said first silicon oxide film.

3. The method as set forth in claim 1, wherein a high frequency voltage is applied to said semiconductor substrate in said step (d) when plasma-enhanced chemical vapor deposition is conducted for the formation of said second silicon oxide film.

4. The method as set forth in claim 1, wherein slurry including pure water, silica dispersed in said pure water, ammonium acetate ($CH_3COONH_4$) and ammonia ($NH_4OH$) and having a pH value at 7 is used in said step (f) for chemical and mechanical polishing.

5. The method as set forth in claim 1, wherein said first silicon oxide film includes nitrogen therein.

6. The method as set forth in claim 1, wherein silicon tetrafluoride ($SiF_4$), silane ($SiH_4$), oxygen ($O_2$) and argon (Ar) gases are used as process gases in said step (d) when plasma-enhanced chemical vapor deposition is conducted for the formation of said second silicon oxide film.

7. The method as set forth in claim 6, wherein a ratio in flow rate of $SiF_4$ to $SiF_4$ and $SiH_4$, that is $SiF_4/(SiF_4+SiH_4)$, is in the range of 0.2 to 0.9 both inclusive.

8. The method as set forth in claim 1, wherein silicon tetrafluoride ($SiF_4$), oxygen ($O_2$), hydrogen ($H_2$) and argon (Ar) gases are used as process gases in said step (d) when plasma-enhanced chemical vapor deposition is conducted for the formation of said second silicon oxide film.

9. The method as set forth in claim 1, wherein bias-sputtering is conducted in said step (d) in place of said plasma-enhanced chemical vapor deposition.

10. The method as set forth in claim 1 further comprising the steps of:
    (h) forming a via hole on said lower wiring layers;
    (i) covering said via hole and said fourth silicon oxide film with a metal film;
    (j) filling said via hole with metal; and
    (k) forming an upper wiring layer on both said via hole and said fourth silicon oxide film.

11. The method as set forth in claim 1, wherein said third silicon oxide film is formed by plasma-enhanced chemical vapor deposition in said step (e) so that said third silicon oxide film also covers a side surface of said second silicon oxide film as well as an upper surface thereof.

12. The method as set forth in claim 11, wherein two high frequency voltages are used when said plasma-enhanced chemical vapor deposition is conducted for the formation of said third silicon oxide film.

13. A method of fabricating a semiconductor device, comprising the steps of:
    (a) forming an insulating film on a semiconductor substrate;
    (b) forming a plurality of lower wiring layers on said insulating film, recesses being formed between said lower wiring layers;
    (c) forming a first silicon oxide film by plasma-enhanced chemical vapor deposition so that said first silicon oxide film covers both said lower wiring layers and said insulating film;
    (d) forming a second silicon oxide film containing fluorine by plasma-enhanced chemical vapor deposition so that said second silicon oxide film covers said first silicon oxide film and further so that portions of said second silicon oxide film formed in said recesses have a top surface higher than a top surface of portions of said first silicon oxide film located on said lower wiring layers, said second silicon oxide film having a greater polishing rate than a polishing rate of said first silicon oxide film;
    (e) chemically and mechanically polishing said second silicon oxide film until a top surface of portions of said first silicon oxide film located on said lower wiring layers appears so that said second silicon oxide film has a planarized top surface on a level with a top surface of portions of said first silicon oxide film located on said lower wiring layers; and
    (f) forming a third silicon oxide film by plasma-enhanced chemical vapor deposition so that said third silicon oxide film entirely covers said first and second silicon oxide films therewith.

14. The method as set forth in claim 13, wherein two high frequency voltages are used in said step (c) when said plasma-enhanced chemical vapor deposition is conducted for the formation of said first silicon oxide film.

15. The method as set forth in claim 13, wherein a high frequency voltage is applied to said semiconductor substrate in said step (d) when plasma-enhanced chemical vapor deposition is conducted for the formation of said second silicon oxide film.

16. The method as set forth in claim 13, wherein slurry including pure water, silica dispersed in said pure water, ammonium acetate ($CH_3COONH_4$) and ammonia ($NH_4OH$) and having a pH value at 7 is used in said step (e) for chemical and mechanical polishing.

17. The method as set forth in claim 13, wherein said first silicon oxide film includes nitrogen therein.

18. The method as set forth in claim 13, wherein silicon tetrafluoride ($SiF_4$), silane ($SiH_4$), oxygen ($O_2$) and argon (Ar) gases are used as process gases in said step (d) when plasma-enhanced chemical vapor deposition is conducted for the formation of said second silicon oxide film.

19. The method as set forth in claim 18, wherein a ratio in flow rate of $SiF_4$ to $SiF_4$ and $SiH_4$, that is $SiF_4/(SiF_4+SiH_4)$, is in the range of 0.2 to 0.9 both inclusive.

20. The method as set forth in claim 13, wherein silicon tetrafluoride ($SiF_4$), oxygen ($O_2$), hydrogen ($H_2$) and argon (Ar) gases are used as process gases in said step (d) when plasma-enhanced chemical vapor deposition is conducted for the formation of said second silicon oxide film.

21. The method as set forth in claim 13, wherein bias-sputtering is conducted in said step (d) in place of said plasma-enhanced chemical vapor deposition.

22. The method as set forth in claim 13 further comprising the steps of:

(h) forming a via hole on said lower wiring layers;

(i) covering said via hole and said third silicon oxide film with a metal film;

(j) filling said via hole with metal; and (k) forming an upper wiring layer on both said via hole and said third silicon oxide film.

* * * * *